(12) United States Patent
Yang et al.

(10) Patent No.: US 11,871,628 B2
(45) Date of Patent: Jan. 9, 2024

(54) METHOD OF MANUFACTURING CONDUCTIVE LINE FOR DISPLAY DEVICE INCLUDING THE SAME

(71) Applicant: Samsung Display Co., Ltd., Yongin-Si (KR)

(72) Inventors: Sukyoung Yang, Hwaseong-si (KR); Sangwoo Sohn, Yongin-si (KR); Dokeun Song, Yongin-si (KR); Dongmin Lee, Anyang-si (KR); Sangwon Shin, Yongin-si (KR); Hyuneok Shin, Gwacheon-si (KR); Kyeong Su Ko, Hwaseong-si (KR); Sang Gab Kim, Seoul (KR); Joongeol Lee, Jeollabuk-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 17/591,268

(22) Filed: Feb. 2, 2022

(65) Prior Publication Data
US 2022/0157920 A1 May 19, 2022

Related U.S. Application Data

(62) Division of application No. 16/720,230, filed on Dec. 19, 2019, now Pat. No. 11,271,067.

(30) Foreign Application Priority Data

Jan. 25, 2019 (KR) .................. 10-2019-0009621

(51) Int. Cl.
*H01L 27/14* (2006.01)
*H10K 59/131* (2023.01)
*H10K 59/121* (2023.01)

(52) U.S. Cl.
CPC ....... *H10K 59/131* (2023.02); *H10K 59/1213* (2023.02); *H10K 59/1216* (2023.02)

(58) Field of Classification Search
CPC ............. H10K 59/131; H10K 59/1213; H10K 59/1216

(Continued)

(56) References Cited

U.S. PATENT DOCUMENTS

2004/0183763 A1   9/2004  Matsui et al.
2004/0222419 A1  11/2004  Matsui et al.
(Continued)

FOREIGN PATENT DOCUMENTS

EP    1458030 A2   9/2004
JP    3790242 B2   6/2006
(Continued)

OTHER PUBLICATIONS

Extended European Search Report, Application No. 20150653.2 dated Oct. 13, 2020, 10 pages.

*Primary Examiner* — Phuc T Dang
(74) *Attorney, Agent, or Firm* — Innovation Counsel LLP

(57) ABSTRACT

A conductive line for a display device may include a first layer including aluminum (Al) or an aluminum alloy, a second layer disposed on the first layer, the second layer including titanium nitride ($TiN_x$), and a third layer disposed on the second layer, the third layer including titanium (Ti) and having a multilayer structure including a plurality of stacked sub-layers.

6 Claims, 12 Drawing Sheets

(58) Field of Classification Search
USPC .......................................................... 257/211
See application file for complete search history.

(56) References Cited

U.S. PATENT DOCUMENTS

| | | |
|---|---|---|
| 2004/0227242 A1 | 11/2004 | Noguchi et al. |
| 2007/0020932 A1 | 1/2007 | Maruyama et al. |
| 2014/0308771 A1 | 10/2014 | Bringham et al. |
| 2014/0342478 A1* | 11/2014 | Choi ........................ H01L 29/45 |
| | | 438/23 |
| 2016/0254337 A1 | 9/2016 | Choi et al. |
| 2018/0053788 A1* | 2/2018 | Lee ........................ H01L 27/124 |
| 2019/0035735 A1 | 1/2019 | Fitzsimmons et al. |
| 2019/0165176 A1* | 5/2019 | Wang .................. H01L 29/7851 |
| 2019/0198534 A1* | 6/2019 | Je ....................... H01L 29/78675 |

FOREIGN PATENT DOCUMENTS

| | | | |
|---|---|---|---|
| JP | 2007115869 A | 5/2007 |
| JP | 4939689 B2 | 5/2012 |
| KR | 10-2017-0010158 A | 1/2017 |
| KR | 10-2018-0032731 A | 4/2018 |
| WO | 2015199638 A1 | 12/2015 |

* cited by examiner

METHOD OF MANUFACTURING CONDUCTIVE LINE FOR DISPLAY DEVICE INCLUDING THE SAME

CROSS-REFERENCE TO RELATED APPLICATION(S)

This application is a divisional application of U.S. patent application Ser. No. 16/720,230 filed on Dec. 19, 2019, now U.S. Pat. No. 11,271,067, which claims priority under 35 USC § 119 to Korean Patent Application No. 10-2019-0009621 filed on Jan. 25, 2019, in the Korean Intellectual Property Office (KIPO), the entire disclosure of which is incorporated by reference herein.

BACKGROUND

1. Field

Embodiments relate to a display device. More particularly, embodiments relate to a conductive line for a display device, a display device including a conductive line, and a method of manufacturing a display device including a conductive line.

2. Description of the Related Art

As display devices for visually representing various electrical signal information have been rapidly developed, various flat panel display devices having excellent characteristics such as a slimness, a light weight, and low power consumption have been used. A liquid crystal display device and an organic light emitting display device among the flat panel display devices are broadly commercialized due to their advantages such as excellent resolution, image quality, etc. Particularly, the organic light emitting display device has been attracting attention due to it's advantages such as a wide viewing angle, a high contrast, and a high response speed.

Recently, a display device having a high resolution is increasingly demanded, therefore, a research that may increase pixel integration per unit area has been carried out. In order to process an image signal at high speed, a conductive line having lower resistance is increasingly required, therefore, a research on using aluminum (Al) in substitution for molybdenum (Mo), etc. as a material of the conductive line has been conducted.

However, a hillock of aluminum (Al) may be generated in the conductive line including aluminum (Al) during a high temperature process. To prevent the generation of the hillock, a capping layer including titanium (Ti), etc. may be additionally formed on the conductive line. However, when a thickness of the capping layer increases, an excessive amount of residue from grains included in the capping layer may be generated during an etching process of the conductive line.

SUMMARY

Embodiments provide a conductive line for a display device in which an excessive amount of residue is not generated and a display device including the conductive line.

Embodiments provide a method of manufacturing a display device including a conductive line for preventing the generation of an excessive amount of residue.

A conductive line for a display device according to embodiments may include a first layer including aluminum (Al) or an aluminum alloy, a second layer disposed on the first layer, the second layer including a refractory metal nitride, and a third layer disposed on the second layer, the third layer including a refractory metal having a multilayer structure including a plurality of stacked sub-layers, the third layer having an interface disposed between adjacent sub-layers.

In an embodiment, the refractory metal nitride may include titanium nitride and the refractory metal may include titanium.

In an embodiment, each of the first layer and the second layer may have a single-layer structure.

In an embodiment, the plurality of sub-layers may include substantially the same material from each other.

In an embodiment, each of the plurality of sub-layers may include titanium.

In an embodiment, the plurality of sub-layers may include different materials from each other.

In an embodiment, a sub-layer of the plurality of sub-layers may includes titanium, and another sub-layer of the plurality of sub-layers may include titanium nitride or titanium oxide.

In an embodiment, thicknesses of the plurality of sub-layers may be substantially equal.

In an embodiment, a thickness of the third layer may be less than a thickness of the first layer.

In an embodiment, a thickness of the second layer may be less than a thickness of the first layer and a thickness of the third layer.

In an embodiment, the third layer may consist of two, three, or four sub-layers.

A display device according to embodiments may include a substrate, a semiconductor layer disposed on the substrate, a first conductive line disposed on the semiconductor layer, and a second conductive line disposed on the first conductive line. The second conductive line may include a first layer including aluminum (Al) or an aluminum alloy, a second layer disposed on the first layer, the second layer including a refractory metal nitride, and a third layer disposed on the second layer, the third layer including a refractory metal and having a multilayer structure including a plurality of stacked sub-layers, the third layer having an interface disposed between adjacent sub-layers.

In an embodiment, the first conductive line may include a first layer including aluminum or an aluminum alloy, a second layer disposed on the first layer, the second layer including titanium nitride, and a third layer disposed on the second layer, the third layer including titanium and having a single-layer structure.

In an embodiment, a thickness of the third layer of the second conductive line may be greater than or substantially equal to a thickness of the third layer of the first conductive line.

In an embodiment, a thickness of each of the plurality of sub-layers of the third layer of the second conductive line may be less than a thickness of the third layer of the first conductive line.

In an embodiment, an average size of grains included in the third layer of the second conductive line may be less than an average size of grains included in the third layer of the first conductive line.

In an embodiment, the display device may further include a third conductive line disposed on the second conductive line. The third conductive line may be in contact with the semiconductor layer via a first contact hole exposing a portion of the semiconductor layer and in contact with the second conductive line via a second contact hole exposing a portion of the second conductive line.

In an embodiment, a depth of the first contact hole may be greater than a depth of the second contact hole.

In an embodiment, the display device may further include a first electrode disposed on the second conductive line, an emission layer disposed on the first electrode, and a second electrode disposed on the emission layer.

A method of manufacturing a display device according to embodiments may include forming a semiconductor layer on a substrate, forming a first conductive line on the semiconductor layer, and forming a second conductive line on the first conductive line, the second conductive line including a first layer including aluminum or an aluminum alloy, a second layer including a refractory metal nitride, and a third layer including a refractory metal. The third layer of the second conductive line may have a multilayer structure including a plurality of stacked sub-layers and the forming the second conductive line may include a vacuum break between forming the sub-layers formed by the discontinuous deposition.

In an embodiment, the first conductive line may include a first layer including aluminum or an aluminum alloy, a second layer including titanium nitride, and a third layer including titanium. The third layer of the first conductive line may be formed without a vacuum breaking during forming the third layer of the first conductive line.

In an embodiment, a thickness of the third layer of the second conductive line may be greater than or substantially equal to a thickness of the third layer of the first conductive line.

In an embodiment, the method may further include forming a first insulation layer covering the semiconductor layer before forming the first conductive line, forming a second insulation layer covering the first conductive line before forming the second conductive line; forming a third insulation layer covering the second conductive line, forming a first contact hole passing through the first insulation layer, the second insulation layer, and the third insulation layer to expose a portion of the semiconductor layer, and a second contact hole passing through the third insulation layer to expose a portion of the second conductive line, and forming a third conductive line on the third insulation layer, the third conductive line filling the first contact hole and the second contact hole.

In an embodiment, the first contact hole and the second contact hole may be substantially simultaneously formed.

In an embodiment, the method may further include forming a first electrode on the second conductive line, forming an emission layer on the first electrode, and forming a second electrode on the emission layer.

A conductive line for a display device according to embodiments may include a first layer including an aluminum (Al) alloy, a second layer disposed on the first layer, the second layer including titanium nitride ($TiN_x$), and a third layer disposed on the second layer, the third layer including titanium (Ti) which has a multilayer structure including a plurality of stacked sub-layers, the third layer having an interface between adjacent sub-layers.

A display device according to embodiments may include a substrate; a switching transistor including a first gate electrode which includes aluminum or an aluminum alloy, a refractory metal nitride and a refractory metal sequentially disposed on the substrate; a driving transistor including a second gate electrode which includes aluminum or an aluminum alloy, a refractory metal nitride and a refractory metal sequentially disposed on the substrate; a light emitting diode having an electrode connected to the driving transistor and disposed on the substrate; wherein the refractory metal in the second gate electrode includes a plurality of stacked sub-layers, the plurality of stacked sub-layers having an interface disposed between adjacent sub-layers.

In an embodiment, the refractory metal in the first gate electrode may have no interface.

In an embodiment, the refractory metal nitride may include titanium nitride and the refractory metal may include titanium.

In an embodiment, each of the plurality of sub-layers may have columnar grains and the columnar grains have discontinuation portions at the interface.

In an embodiment, the refractory metal in the driving transistor may include a titanium layer and a titanium nitride layer or a titanium oxide layer disposed on the titanium layer.

In an embodiment, the refractory metal in the driving transistor may include a plurality of titanium layers sequentially stacked with the interface between the adjacent sub-layers.

In an embodiment, the display device may further include a capacitor connected between a source electrode and a gate electrode of the driving transistor. The capacitor may include a first electrode having a same structure as the first gate electrode and a second electrode having a same structure as the second gate electrode In an embodiment, an average size of grains included in the refractory metal in the driving transistor may be less than an average size of grains included in the refractory metal in the switching transistor.

In the conductive line for the display device and the display device including the same according to the embodiments, the conductive line may include the first layer including aluminum or aluminum alloy, the second layer including titanium nitride, and the third layer including titanium, and the third layer may have the multilayer structure including the plurality of sub-layers. Accordingly, the conductive line in which an excessive amount of residue is not generated during the etching process may be provided.

In the method of manufacturing the display device including the conductive line according to the embodiments, the plurality of sub-layers of the third layer of the conductive line may be formed by the discontinuous deposition. Accordingly, an excessive amount of residue being generated during the etching process may be prevented.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, conductive lines, display devices, and methods of manufacturing display devices in accordance with embodiments will be explained in detail with reference to the accompanying drawings.

Hereinafter, a conductive line for a display device and a display device including the same according to an embodiment will be described with reference to FIGS. 1 to 7C.

Figure 1:
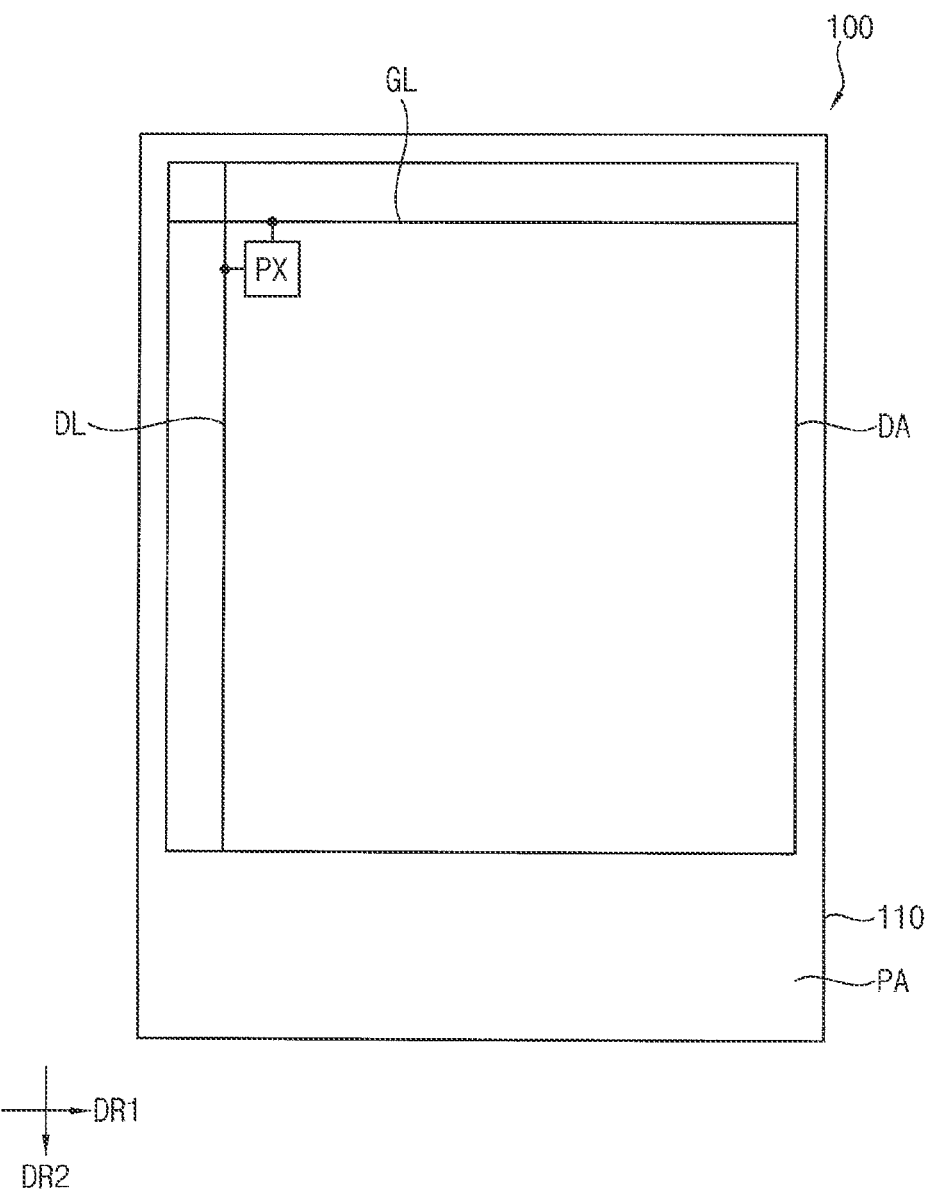
FIG. 1 is a plan view illustrating a display device according to an embodiment.

FIG. 1 is a plan view illustrating a display device according to an embodiment.

Referring to FIG. 1, a display device 100 may include a substrate 110 and a plurality of pixels PX disposed on the substrate 110.

The substrate 110 may include a display area DA and a peripheral area PA. The peripheral area PA may be located outside the display area DA. The peripheral area PA may be located at at least one side of the display area DA.

A plurality of gate lines GL and a plurality of data lines DL may be disposed in the display area DA. The gate lines GL may extend in a first direction DR1, and may be arranged along a second direction DR2 crossing the first direction DR1. The data lines DL may extend in the second direction DR2, and may be arranged along the first direction DR1. The gate lines GL and the data lines DL may be respectively connected to a gate driver and a data driver disposed in the peripheral area PA, and may respectively receive a gate signal and a data signal.

The pixels PX may be respectively disposed at intersections between the gate lines GL and the data lines DL, and each pixel PX may be connected to a respective gate line GL and a respective data line DL to receive the gate signal and the data signal. Each of the pixels PX may emit light in response to the gate signal and the data signal, and the light emitted from each of the pixels PX may display an image in the display area DA. The pixels PX may not be disposed in the peripheral area PA, therefore, the peripheral area PA may be a non-display area.

Figure 2:
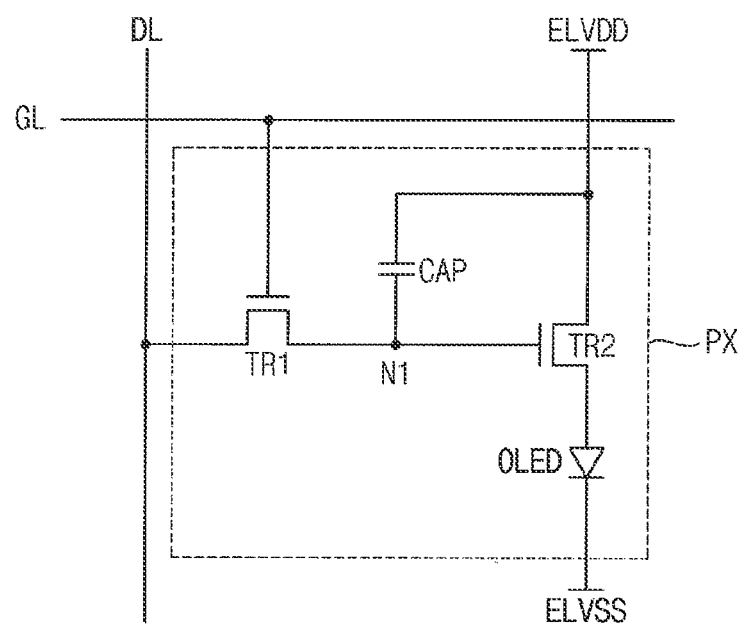
FIG. 2 is a circuit diagram illustrating an example of a pixel in FIG. 1.

FIG. 2 is a circuit diagram illustrating an example of the pixel PX in FIG. 1.

Referring to FIG. 2, the pixel PX may be electrically connected to the gate line GL, the data line DL, a first power source ELVDD, and a second power source ELVSS. In an embodiment, a voltage level of the first power source ELVDD may be greater than a voltage level of the second power source ELVSS.

In an embodiment, the pixel PX may include a first transistor TR1 (a switching transistor), a second transistor TR2 (a driving transistor), a capacitor CAP, and an organic light emitting diode OLED. However, the present disclosure is not limited thereto, and in another embodiment, the pixel PX may include three or more transistors and/or two or more capacitors. Furthermore, in another embodiment, elements of the pixels PX may be connected differently from the connection of the elements of the pixels PX illustrated in FIG. 2.

The first transistor TR1 may have a gate electrode connected to the gate line GL, a source electrode connected to the data line DL, and a drain electrode connected to a first node N1. The second transistor TR2 may have a gate electrode connected to the first node N1, a source electrode connected to the first power source ELVDD, and a drain electrode connected to the organic light emitting diode OLED. The capacitor CAP may have a first capacitor electrode connected to the first node N1 and a second capacitor electrode connected to the first power source ELVDD. The organic light emitting diode OLED may have an anode connected to the second transistor TR2 and a cathode connected to the second power source ELVSS.

The first transistor TR1 may transmit the data signal received from the data line DL to the first node N1 when the first transistor TR1 is turned on by the gate signal received from the gate line GL. The second transistor TR2 may provide a driving current to the organic light emitting diode OLED in response to a voltage between the first power source ELVDD and the first node N1 which is stored in the capacitor CAP, and the organic light emitting diode OLED may emit light according to the driving current.

Figure 3:
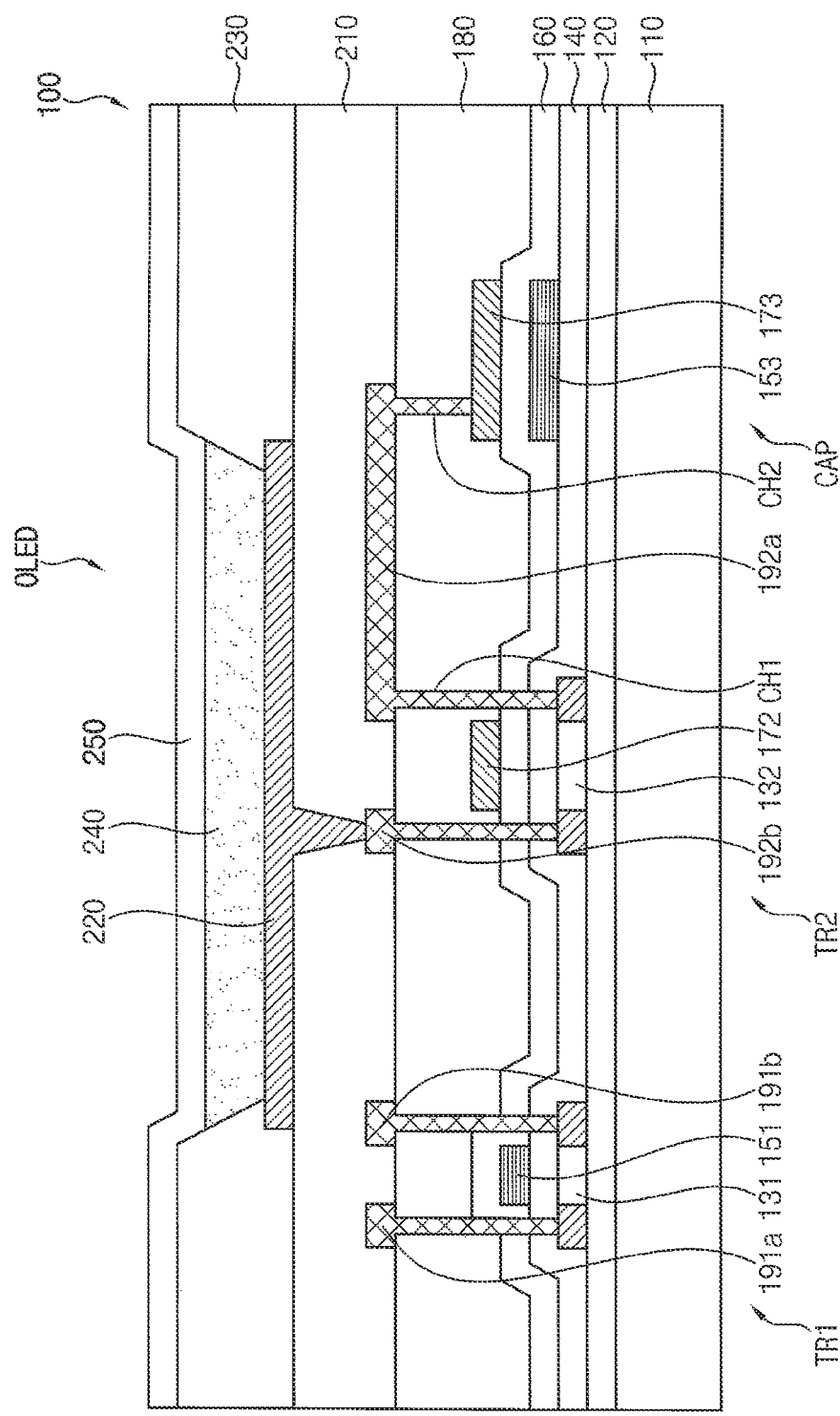
FIG. 3 is a cross-sectional view illustrating a display device according to an embodiment.

FIG. 3 is a cross-sectional view illustrating a display device according to an embodiment. For example, FIG. 3 may illustrate the pixel PX in FIG. 2.

Referring to FIG. 3, the display device 100 may include the first transistor TR1, the second transistor TR2, the capacitor CAP, and the organic light emitting diode OLED which are disposed on the substrate 110. A semiconductor layer 131 and 132, a first conductive line 151 and 153, a second conductive line 172 and 173, a third conductive line 191*a*, 191*b*, 192*a*, and 192*b*, a first electrode 220, an emission layer 240, and a second electrode 250 which are sequentially stacked may be disposed on the substrate 110.

The substrate 110 may be an insulating substrate including glass, quartz, plastic, or the like.

A buffer layer 120 may be disposed on the substrate 110. The buffer layer 120 may block impurities such as oxygen, moisture, etc. permeating through the substrate 110. Further, the buffer layer 120 may provide a planarized surface over the substrate 110. The buffer layer 120 may be an inorganic insulating layer including silicon nitride, silicon oxide, silicon oxynitride, etc. Alternatively, the buffer layer 120 may be omitted.

The semiconductor layer 131 and 132 may be disposed on the buffer layer 120. The semiconductor layer 131 and 132 may include a first semiconductor 131 and a second semiconductor 132 which are spaced apart from each other. The semiconductor layer 131 and 132 may be formed of amorphous silicon, polycrystalline silicon, an oxide semiconductor, or the like. Each of the first semiconductor 131 and the second semiconductor 132 may include a source region, a drain region, and a channel region formed between the source region and the drain region.

A first insulation layer 140 may be disposed on the semiconductor layer 131 and 132. The first insulation layer 140 may be disposed on the buffer layer 120, and may cover the semiconductor layer 131 and 132. The first insulation layer 140 may insulate the first conductive line 151 and 153 from the semiconductor layer 131 and 132. The first insulation layer 140 may be an inorganic insulating layer including silicon nitride, silicon oxide, silicon oxynitride, etc. In an embodiment, the first insulation layer 140 may be a silicon oxide layer having a thickness of from about 600 Å to about 1400 Å.

The first conductive line 151 and 153 may be disposed on the first insulation layer 140. The first conductive line 151 and 153 may include a first gate electrode 151 and a first capacitor electrode 153 which are spaced apart from each other. The first gate electrode 151 may overlap the channel region of the first semiconductor 131.

Figure 4:
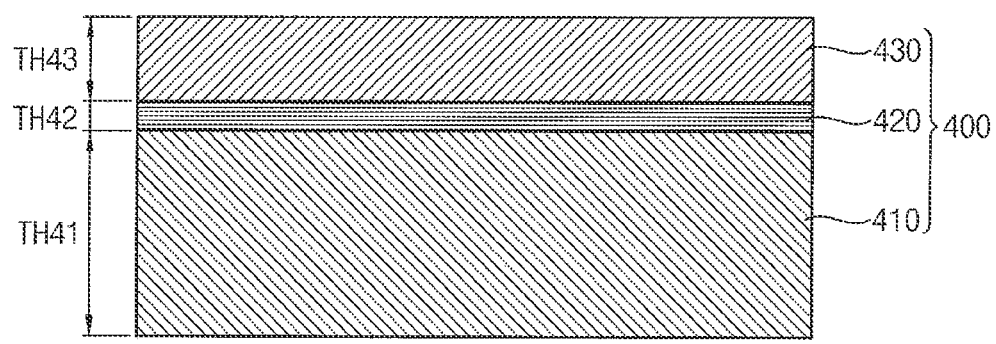
FIG. 4 is a cross-sectional view illustrating a first conductive line in FIG. 3.

FIG. 4 is a cross-sectional view illustrating the first conductive line 151 and 153 in FIG. 3.

Referring to FIG. 4, the first conductive line 400 may include a plurality of layers 410, 420, and 430. The first conductive line 400 in FIG. 4 may correspond to the first conductive line 151 and 153 in FIG. 3. The first conductive line 400 may include a first layer 410, a second layer 420 disposed on the first layer 410, and a third layer 430 disposed on the second layer 420.

The first layer 410 may include aluminum (Al) or an aluminum alloy. The aluminum may have a relatively low resistivity, therefore, the first layer 410 may serve as a main conductive layer of the first conductive line 400. In an embodiment, the first layer 410 may have a single-layer structure. In such an embodiment, the first layer 410 may include aluminum or an aluminum alloy which has high conductivity. In an embodiment, a thickness TH41 of the first layer 410 may be in a range of from about 1000 Å to about 1800 Å.

The second layer 420 may include a refractory metal nitride, for example, titanium nitride ($TiN_x$). The second layer 420 may be disposed between the first layer 410 and the third layer 430, and may serve as an auxiliary conductive layer, for example, a diffusion barrier layer which prevents materials from being diffused between the first layer 410 and the third layer 430. Because the second layer 420 is formed between the first layer 410 and the third layer 430, the diffusion of the materials between the first layer 410 and the third layer 430 may decrease or substantially prevented. Therefore, the formation of an metal alloy having a relatively high resistivity at an interface between the first layer and the third layer may be prevented. In an embodiment, the second layer 420 may have a single-layer structure. In such an embodiment, the second layer 420 may include titanium nitride ($TiN_x$). In an embodiment, a thickness TH42 of the second layer 420 may be in a range of from about 100 Å to about 300 Å.

The third layer 430 may include refractory metal, for example, titanium (Ti). The third layer 430 may not have an interface in it. The third layer 430 may serve as a capping layer for preventing a hillock of the aluminum included in first layer 410 which can be generated in a high temperature process. In an embodiment, the third layer 430 may have a single-layer structure. In such an embodiment, the third layer 430 may consist of titanium (Ti). In an embodiment, a thickness TH43 of the third layer 430 may be in a range of from about 300 Å to about 700 Å.

In an embodiment, the thickness TH43 of the third layer 430 may be less than the thickness TH41 of the first layer 410. Since the third layer 430 serves as a capping layer, the third layer 430 may have a relatively small thickness to decrease a stepped portion due to the first conductive line 400. In an embodiment, the thickness TH42 of the second layer 420 may be less than the thickness TH41 of the first layer 410 and the thickness TH43 of the third layer 430. Because the second layer includes refractory metal nitride 420 having a relatively high resistivity, the second layer 420 may have a thickness less than those of the first layer 410 and the third layer 430 including metal.

Referring to FIG. 3 again, a second insulation layer 160 may be disposed on the first conductive line 151 and 153. The second insulation layer 160 may be disposed on the first insulation layer 140, and may cover the first conductive line 151 and 153. The second insulation layer 160 may insulate the second conductive line 172 and 173 from the first conductive line 151 and 153. The second insulation layer 160 may be an inorganic insulating layer including silicon nitride, silicon oxide, silicon oxynitride, etc. In an embodiment, the second insulation layer 160 may be a silicon nitride layer having a thickness of from about 600 Å to about 1400 Å.

The second conductive line 172 and 173 may be disposed on the second insulation layer 160. The second conductive line 172 and 173 may include a second gate electrode 172 and a second capacitor electrode 173 which are spaced apart from each other. The second gate electrode 172 may overlap the channel region of the second semiconductor 132. The second capacitor electrode 173 may overlap the first capacitor electrode 153. The first capacitor electrode 153 and the second capacitor electrode 173 may form the capacitor CAP.

A third insulation layer 180 may be disposed on the second conductive line 172 and 173. The third insulation layer 180 may be disposed on the second insulation layer 160, and may cover the second conductive line 172 and 173. The third insulation layer 180 may insulate the third conductive line 191a, 191b, 192a, and 192b from the second conductive line 172 and 173. The third insulation layer 180 may be an organic insulating layer including acryl-based resin, epoxy-based resin, polyimide-based resin, polyester-based resin, etc., or an inorganic insulating layer including silicon nitride, silicon oxide, silicon oxynitride, etc. The third insulation layer 180 may be a multi-layer structure having an inorganic layer and an organic layer disposed on the inorganic layer or an organic layer disposed between inorganic layers The third conductive line 191a, 191b, 192a, and 192b may be disposed on the third insulation layer 180. The third conductive line 191a, 191b, 192a, and 192b may include a first source electrode 191a, a first drain electrode 191b, a second source electrode 192a, and a second drain electrode 192b which are spaced apart from each other. The first source electrode 191a and the first drain electrode 191b may be in contact with the source region and the drain region of the first semiconductor 131, respectively, via contact holes passing through the first insulation layer 140, the second insulation layer 160, and the third insulation layer 180.

The second source electrode 192a may be in contact with the source region of the second semiconductor 132 via a first contact hole CH1 exposing a portion of the second semiconductor 132, and may be in contact with the second capacitor electrode 173 via a second contact hole CH2 exposing a portion of the second capacitor electrode 173. The first contact hole CH1 may pass through the first insulation layer 140, the second insulation layer 160, and the third insulation layer 180, and the second contact hole CH2 may pass through the third insulation layer 180. In this case, a depth of the first contact hole CH1 may be greater than a depth of the second contact hole CH2.

The second drain electrode 192b may be in contact with the drain region of the second semiconductor 132 via a contact hole passing through the first insulation layer 140, the second insulation layer 160, and the third insulation layer 180. The first semiconductor 131, the first gate electrode 151, the first source electrode 191a, and the first drain electrode 191b may form the first transistor TR1, and the second semiconductor 132, the second gate electrode 172, the second source electrode 192a, and the second drain electrode 192b may form the second transistor TR2.

Figure 5:
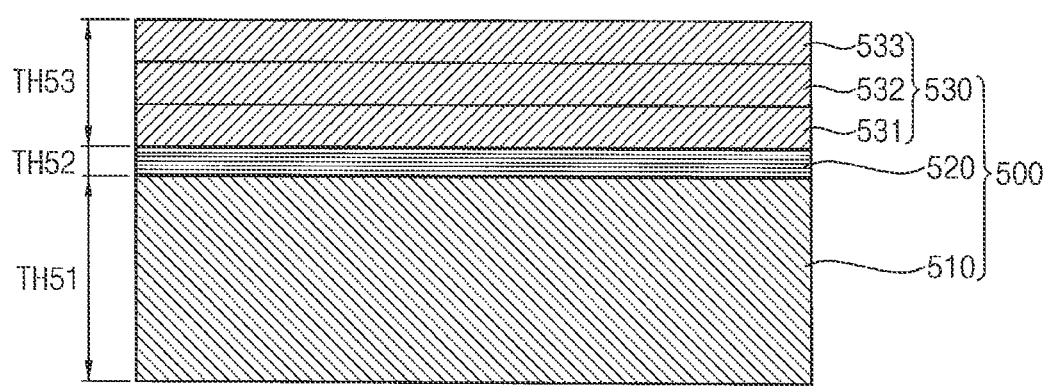
FIG. 5 is a cross-sectional view illustrating a second conductive line in FIG. 3.

FIG. 5 is a cross-sectional view illustrating the second conductive line 172 and 173 in FIG. 3.

Referring to FIG. 5, the second conductive line 500 may include a plurality of layers 510, 520, and 530. The second conductive line 500 in FIG. 5 may correspond to the second conductive line 172 and 173 in FIG. 3. The second conductive line 500 may include a first layer 510, a second layer 520 disposed on the first layer 510, and a third layer 530 disposed on the second layer 520.

The first layer 510 may include aluminum (Al) or an aluminum alloy. The aluminum may have a relatively low resistivity, therefore, the first layer 510 may serve as a main conductive layer of the second conductive line 500. In an embodiment, the first layer 510 may have a single-layer structure. In such an embodiment, the first layer 510 may include aluminum or an aluminum alloy. In an embodiment, a thickness TH51 of the first layer 510 may be in a range of from about 1000 Å to about 1800 Å. In an embodiment, the first layer 510 of the second conductive line 500 may include substantially the same material as that of the first layer 410 of the first conductive line 400, and may have substantially the same thickness as that of the first layer 410 of the first conductive line 400.

The second layer 520 may include refractory metal nitride, for example, titanium nitride ($TiN_x$). The second layer 520 may be disposed between the first layer 510 and the third layer 530, and may serve as an auxiliary conductive layer which prevents materials from being diffused between the first layer 510 and the third layer 530. Because the second layer 520 is formed between the first layer 510 and the third layer 530, the diffusion of the materials between the first layer 510 and the third layer 530 may decrease or substantially prevented. Therefore, the formation of an metal alloy having a relatively high resistivity may be prevented at an interface between the first layer and the third layer. In an embodiment, the second layer 520 may have a single-layer structure. In such an embodiment, the second layer 520 may include a refractory metal nitride, for example, titanium nitride ($TiN_x$). In an embodiment, a thickness TH52 of the second layer 520 may be in a range of from about 100 Å to about 300 Å. In an embodiment, the second layer 520 of the second conductive line 500 may include substantially the same material as that of the second layer 420 of the first conductive line 400, and may have substantially the same thickness as that of the second layer 420 of the first conductive line 400.

The third layer 530 may include titanium (Ti). The third layer 530 may serve as a capping layer for preventing a hillock of the aluminum included in first layer 510 which can be generated in a high temperature process. In an embodiment, a thickness TH53 of the third layer 530 may be in a range of from about 600 Å to about 1000 Å.

The third layer 530 may have a multilayer structure. The third layer 530 may include a plurality of stacked sub-layers 531, 532, and 533. In an embodiment, the third layer 530 may include three sub-layers 531, 532, and 533. For example, the third layer 530 may include a first sub-layer 531, a second sub-layer 532, and a third sub-layer 533 which are sequentially stacked with an interface disposed between adjacent sub-layers. Each of the three sub-layers 531, 532, and 533 may has columnar grains having discontinuation portions at the interface However, the present disclosure is not limited thereto, and in another embodiment, the third layer 530 may include two or four sub-layers. In another embodiment, the third layer 530 may include five or more sub-layers. Hereinafter, it is exemplarily described that the third layer 530 includes three sub-layers 531, 532, and 533 in the present embodiment.

In an embodiment, the plurality of sub-layers 531, 532, and 533 may include substantially the same material. In such an embodiment, each of the plurality of sub-layers 531, 532, and 533 may include refractory metal, for example, titanium (Ti), refractory metal nitride or refractory metal oxide.

In another embodiment, the plurality of sub-layers 531, 532, and 533 may include different materials from each other. In such an embodiment, a sub-layer of the plurality of sub-layers 531, 532, and 533 may include titanium (Ti), and another sub-layer of the plurality of sub-layers 531, 532, and 533 may include titanium nitride ($TiN_x$) or titanium oxide ($TiO_x$). For example, each of the first sub-layer 531 and the third sub-layer 533 may include titanium, and the second sub-layer 532 may include titanium nitride.

In an embodiment, thicknesses of the plurality of sub-layers 531, 532, and 533 may be substantially equal. For example, when a total thickness TH53 of the third layer 530 including three sub-layers 531, 532, and 533 is about 600 Å, a thickness of each of the sub-layers 531, 532, and 533 may be about 200 Å. However, the present disclosure is not limited thereto, and in another embodiment, thicknesses of the plurality of sub-layers 531, 532, and 533 may be different from each other.

In an embodiment, the thickness TH53 of the third layer 530 may be less than the thickness TH51 of the first layer 510. Since the third layer 530 serves as a capping layer, the third layer 530 may have a relatively small thickness to decrease a stepped portion due to the second conductive line 500. In an embodiment, the thickness TH52 of the second layer 520 may be less than the thickness TH51 of the first layer 510 and the thickness TH53 of the third layer 530. Because the second layer 520 includes refractory metal nitride having relatively high resistivity, the second layer 520 may have a thickness less than those of the first layer 510 and the third layer 530 including metal.

In an embodiment, the thickness TH53 of the third layer 530 of the second conductive line 500 may be greater than or substantially equal to the thickness TH43 of the third layer 430 of the first conductive line 400. When the first contact hole CH1 and the second contact hole CH2 are simultaneously formed, because the depth of the first contact hole CH1 is greater than the depth of the second contact hole CH2 as described above, the third layer 530 of the second conductive line 500 may be etched during the formation of the first contact hole CH1. Because the third layer 530 of the second conductive line 500 has a relatively large thickness, the second layer 520 and the first layer 510 of the second conductive line 500 may prevented from etching.

Figure 6A:
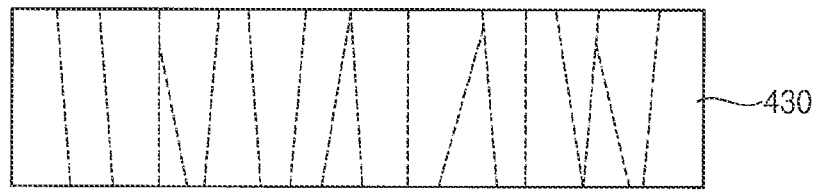
FIGS. 6A and 6B are diagrams illustrating grains in a third layer of the first conductive line in FIG. 4.
Figure 6B:
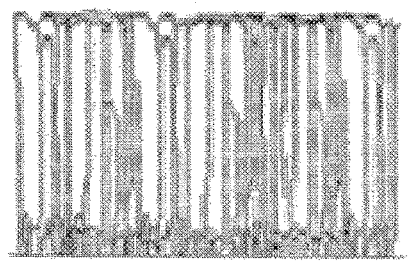
Figure 7A:
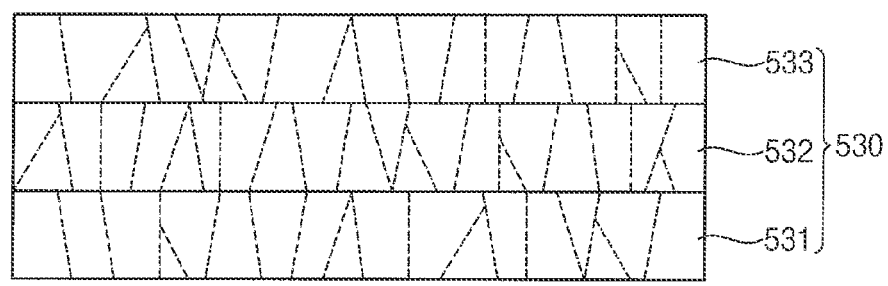
FIGS. 7A, 7B, and 7C are diagrams illustrating grains in a third layer of the second conductive line in FIG. 5.
Figure 7B:
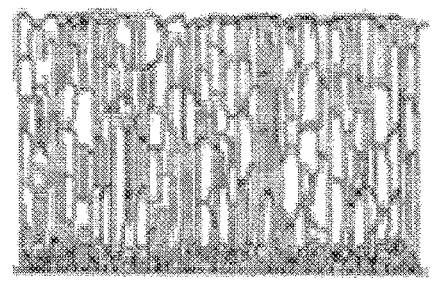
Figure 7C:
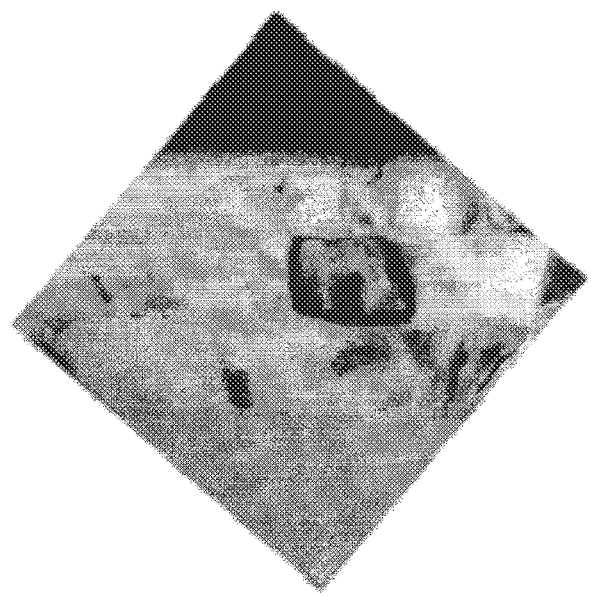

FIGS. 6A and 6B are diagrams illustrating grains in the third layer 430 of the first conductive line 400 in FIG. 4. FIGS. 7A, 7B, and 7C are diagrams illustrating grains in the third layer 530 of the second conductive line 500 in FIG. 5.

In an embodiment, a thickness of each of the sub-layers 531, 532, and 533 of the third layer 530 of the second conductive line 500 may be less than the thickness TH43 of the third layer 430 of the first conductive line 400. When a metal layer has a multilayer structure including a plurality of sub-layers, the metal layer may include grains having sizes less than those of grains included in a metal layer having a single-layer structure. FIGS. 6A and 6B illustrate grains having relatively large sizes included in the third layer 430 of the first conductive line 400, and FIGS. 7A, 7B, and 7C illustrate grains having relatively small sizes included in the third layer 530 of the second conductive line 500. Number of grains per unit volume included in the third layer 530 of the second conductive line 500 having a multilayer structure including a plurality of sub-layers 531, 532, and 533 may be greater than an amount of grains per unit volume included in the third layer 430 of the first conductive line 400 having a single-layer structure. Accordingly, an average size of the grains included in the third layer 530 of the second conductive line 500 may be less than an average size of the grains included in the third layer 430 of the first conductive line 400. For example, an average height of the columnar grains included in the third layer 530 of the second conductive line 500 may be less than an average height of the columnar grains included in the third layer 430 of the first conductive line 400. Therefore, the thickness of each of the sub-layers 531, 532, and 533 of the third layer 530 of the second conductive line 500 which corresponds to heights of the columnar grains, which are grow along a direction perpendicular to the substrate 110 included in the third layer 530 of the second conductive line 500 may be less than the thickness TH43 of the third layer 430 of the first conductive line 400 which corresponds to heights of the columnar grains included in the third layer 430 of the first conductive line 400.

Referring to FIG. 3 again, a fourth insulation layer 210 may be disposed on the third conductive line 191a, 191b, 192a, and 192b. The fourth insulation layer 210 may be disposed on the third insulation layer 180, and may cover the third conductive line 191a, 191b, 192a, and 192b. The fourth insulation layer 210 may provide a planarized surface over the third conductive line 191a, 191b, 192a, and 192b. The fourth insulation layer 210 may be an organic insulating layer including acryl-based resin, epoxy-based resin, polyimide-based resin, polyester-based resin, etc., or an inorganic insulating layer including silicon nitride, silicon oxide, silicon oxynitride, etc.

The first electrode 220 may be disposed on the fourth insulation layer 210. The first electrode 220 may be patterned for each pixel. The first electrode 220 may be electrically connected to the second transistor TR2 via a contact hole formed in the fourth insulation layer 210. The first electrode 220 may include a metal, a transparent conductive oxide, or the like.

A fifth insulation layer 230 may be disposed on the first electrode 220. The fifth insulation layer 230 may be disposed on the fourth insulation layer 210, and may cover edges of the first electrode 220. The fifth insulation layer 230 may include an opening exposing a portion of the first electrode 220. For example, the opening of the fifth insulation layer 230 may expose a central portion of the first electrode 220, therefore, the fifth insulation layer 230 may define an emission area corresponding to the central portion of the first electrode 220. The fifth insulation layer 230 may include an organic insulating material such as acryl-based resin, epoxy-based resin, polyimide-based resin, polyester-based resin, etc.

The emission layer 240 may be disposed on the first electrode 220. The emission layer 240 may be disposed on a portion of the first electrode 220 exposed by the opening of the fifth insulation layer 230. Electrons and holes may be combined in the emission layer 240 to emit light. In an embodiment, a hole injection layer (HIL) for injecting holes and/or a hole transport layer (HTL) having excellent hole transporting property and for increasing chance of recombination of holes and electrons by restraining the movement of electrons that are not combined in the emission layer 240 may be disposed between the first electrode 220 and the emission layer 240. In an embodiment, a hole blocking layer (HBL) for restraining the movement of holes that are not combined in the emission layer 240, an electron transport layer (ETL) for easily transporting electrons to the emission layer 240, and/or an electron injection layer (EIL) for injecting electrons may be disposed on the emission layer 240.

The second electrode 250 may be disposed on the emission layer 240. The second electrode 250 may be commonly formed over the plurality of pixels. The second electrode 250 may include a metal, a transparent conductive oxide, or the like. The first electrode 220, the emission layer 240, and the second electrode 250 may form the organic light emitting diode OLED. In an embodiment, the first electrode 220 may be an anode of the organic light emitting diode OLED, and the second electrode 250 may be a cathode of the organic light emitting diode OLED. However, the present disclosure is not limited thereto, and in another embodiment, the first electrode 220 may be the cathode of the organic light emitting diode OLED, and the second electrode 250 may be the anode of the organic light emitting diode OLED.

Hereinafter, a method of manufacturing a display device including a conductive line according to an embodiment will be described with reference to FIGS. 3, 8 to 12.

FIGS. 8, 9, 10, 11, and 12 are cross-sectional views illustrating a method of manufacturing a display device according to an embodiment.

Figure 8:
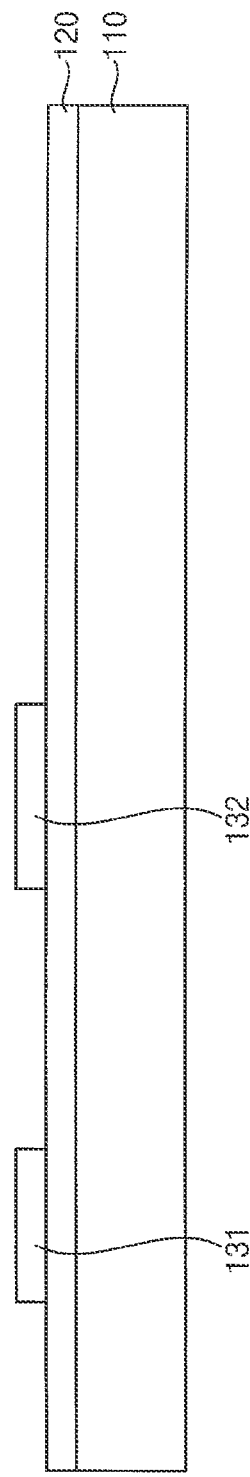
FIGS. 8, 9, 10, 11, and 12 are cross-sectional views illustrating a method of manufacturing a display device according to an embodiment.

Referring to FIG. 8, an inorganic insulating material may be deposited on the substrate 110 to form the buffer layer 120. Then, a semiconductor material may be deposited on the buffer layer 120 and patterned to form the semiconductor layer 131 and 132 including the first semiconductor 131 and the second semiconductor 132.

Figure 9:
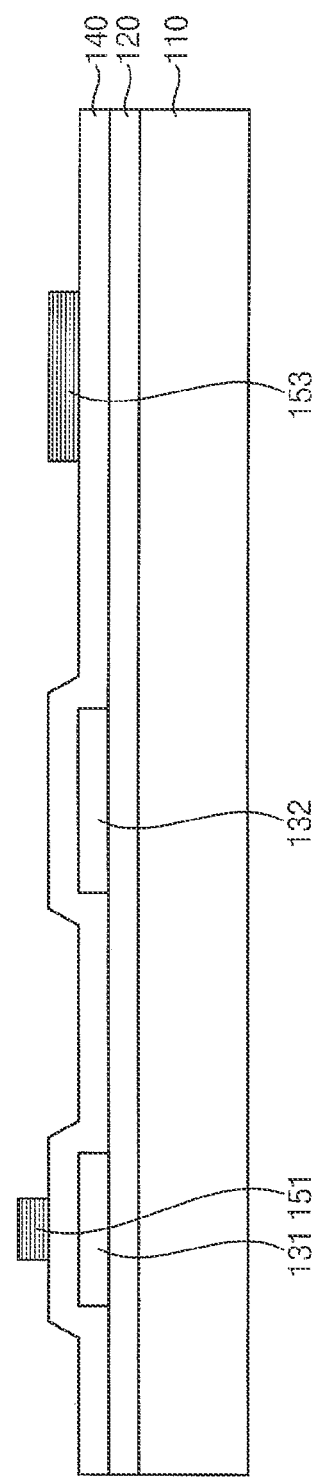

Referring to FIG. 9, an inorganic insulating material may be deposited on the buffer layer 120 on which the semiconductor layer 131 and 132 is formed to form the first insulation layer 140. Then, a conductive material such as a metal, etc. may be deposited on the first insulation layer 140 and patterned to form the first conductive line 151 and 153 including the first gate electrode 151 and the first capacitor electrode 153.

More specifically describing the formation of the first conductive line 151 and 153, aluminum (Al) or an aluminum alloy may be deposited, titanium nitride ($TiN_x$) may be deposited on the aluminum (Al) or the aluminum alloy, titanium (Ti) may be deposited in the titanium (Yi), and the deposited aluminum (Al) or the aluminum alloy, the titanium nitride ($TiN_x$) and the titanium (Ti) may be patterned to form the first conductive line 400 including the first layer 410, the second layer 420, and the third layer 430 as illustrated in FIG. 4. The third layer 430 of the first conductive line 400 may be formed by a vacuum deposition such as a sputtering. The third layer 430 of the first conductive line 400 may be formed by a continuous deposition of titanium (Ti). Such deposition of a material without breaking a vacuum in an overall deposition process is referred to as a continuous deposition. By such a continuous deposition, the third layer 430 of the first conductive line 400 having a single-layer structure including columnar grains having relatively large sizes may be formed as illustrated in FIGS. 6A and 6B.

Figure 10:
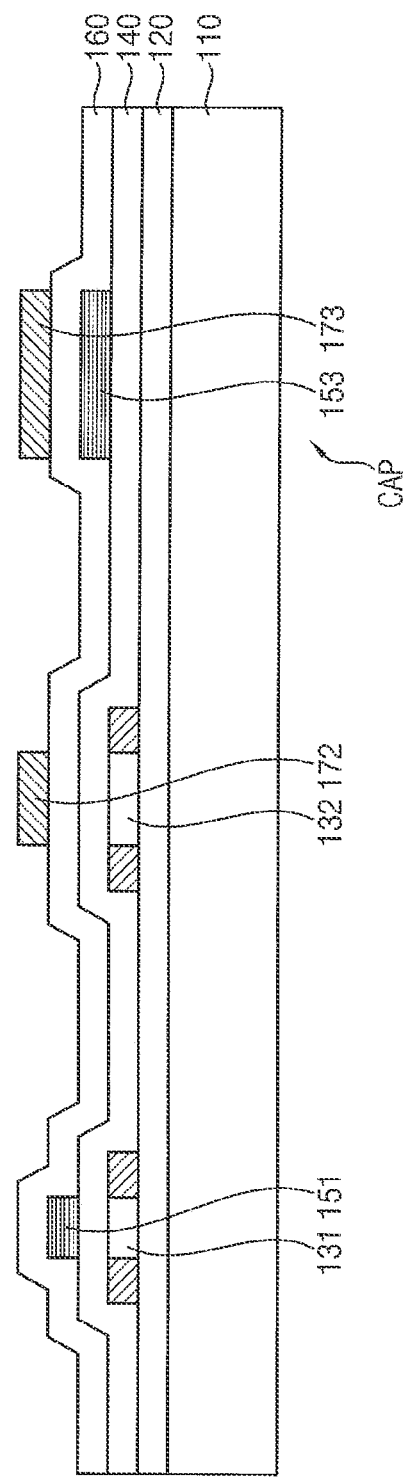

Referring to FIG. 10, an inorganic insulating material may be deposited on the first insulation layer 140 on which the first conductive line 151 and 153 is formed to form the second insulation layer 160. Then, a conductive material such as a metal, etc. may be deposited on the second insulation layer 160 and patterned to form the second conductive line 172 and 173 including the second gate electrode 172 and the second capacitor electrode 173. In this case, the capacitor CAP including the first capacitor electrode 153 and the second capacitor electrode 173 may be formed. Then, impurities may be doped to form the source region and the drain region of the first semiconductor 131 and the source region and the drain region of the second semiconductor 132.

More specifically describing the formation of the second conductive line 172 and 173, aluminum (Al) or an aluminum alloy may be deposited, titanium nitride (TiN$_x$) may be deposited on the aluminum (Al) or the aluminum alloy, and titanium (Ti), titanium nitride (TiN$_x$), and/or titanium oxide (TiO$_x$) may be deposited on the titanium nitride (TiN$_x$), and the deposited aluminum (Al) or the aluminum alloy, the titanium nitride (TiN$_x$) and the titanium (Ti), titanium nitride (YiN$_x$), and/or titanium oxide (TiO$_x$) may be patterned to form the second conductive line 500 including the first layer 510, the second layer 520, and the third layer 530 as illustrated in FIG. 5. The third layer 530 of the second conductive line 500 may be formed by a vacuum deposition such as a sputtering. The third layer 530 of the second conductive line 500 may be formed by a discontinuous deposition of titanium (Ti), titanium nitride (TiN$_x$), and/or titanium oxide (TiO$_x$). For example, one of titanium (Ti), titanium nitride (TiN$_x$), and titanium oxide (TiO$_x$) is deposited in a first deposition process, a vacuum breaking in which the first deposition is terminated, and one of titanium (Ti), titanium nitride (TiN$_x$), and titanium oxide (TiO$_x$) is deposited thereon in a second deposition, a vacuum breaking in which the second deposition is terminated, one of titanium (Ti), titanium nitride (TiN$_x$), and titanium oxide (TiO$_x$) is deposited thereon, and those are patterned to form the third layer 530 of the second conductive line 500 including the first layer 510, the second layer 520, and the third layer 530. Such deposition of a material with at least one vacuum breaking in an overall deposition process is referred to as a discontinuous deposition. A deposition condition (e.g., time, temperature, etc.) in the forming of the first sub-layer 531, a deposition condition in the forming of the second sub-layer 532, and a deposition condition in the forming of the third sub-layer 533 may be substantially the same as or different from each other. Further, the first sub-layer 531, the second sub-layer 532, and the third sub-layer 533 may be formed of substantially the same material or different materials. Accordingly, the first sub-layer 531, the second sub-layer 532, and the third sub-layer 533 that are discontinuous and have an interface formed therebetween may be formed. By such a discontinuous deposition, the third layer 530 of the second conductive line 500 having a multilayer structure including grains having relatively small sizes may be formed as illustrated in FIGS. 7A to 7C.

In an embodiment, a thickness of the third layer 530 of the second conductive line 500 may be greater than or substantially equal to a thickness of the third layer 430 of the first conductive line 400. As a thickness of a metal layer increases, a large amount of residue may be generated during a patterning process of the metal layer. However, according to the present embodiment, the third layer 530 of the second conductive line 500 having a relatively large thickness may be formed by the discontinuous deposition thereby including a plurality of sub-layers 531, 532, and 533. Further, the grains included in the third layer 530 of the second conductive line 500 may have relatively small sizes, so that it is possible to prevent an excessive amount of residue from being generated in the patterning process of the third layer 530 of the second conductive line 500.

Figure 11:
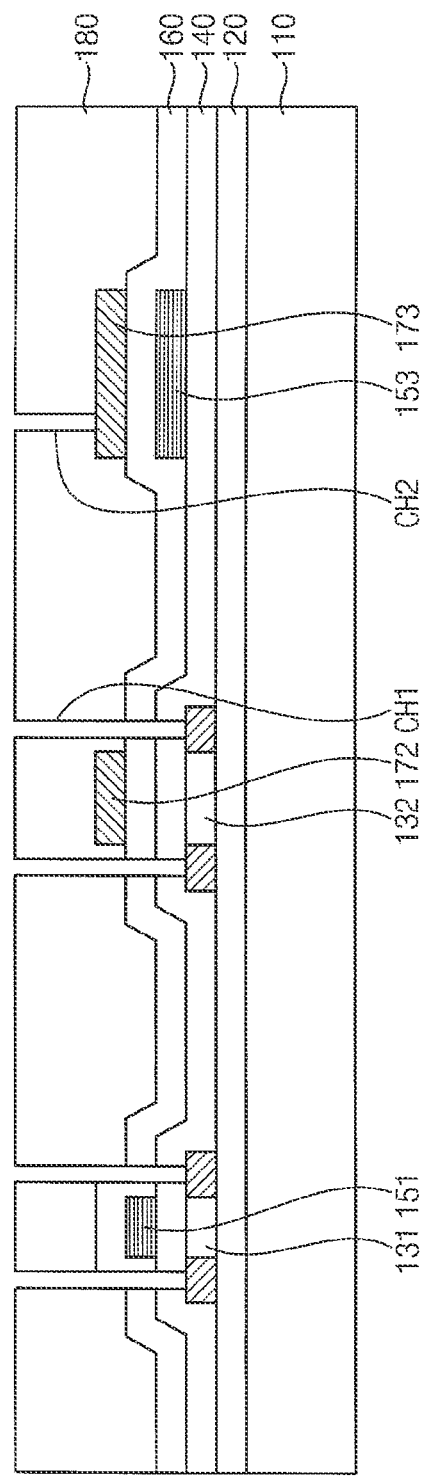

Referring to FIG. 11, an organic insulating material or an inorganic insulating material may be deposited on the second insulation layer 160 on which the second conductive line 172 and 173 is formed to form the third insulation layer 180. Then, the third insulation layer 180, the second insulation layer 160, and the first insulation layer 140 may be etched to form contact holes including the first contact hole CH1, and the third insulation layer 180 may be etched to form the second contact hole CH2. The first contact hole CH1 and the second contact hole CH2 may be substantially simultaneously formed.

Figure 12:
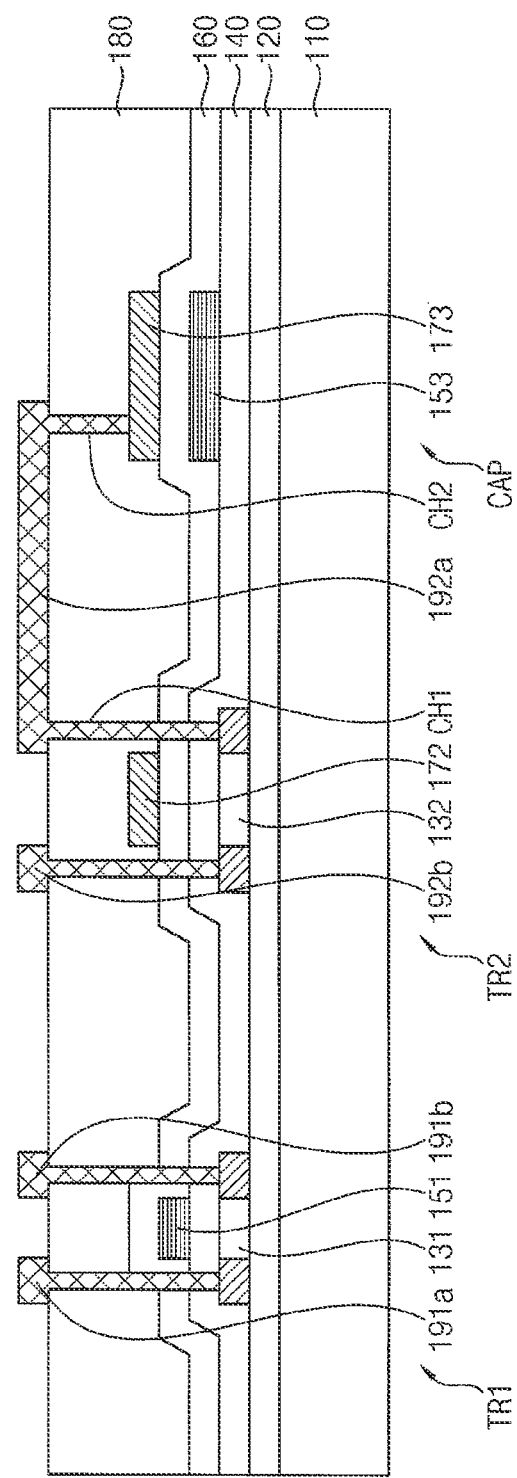

Referring to FIG. 12, a conductive material may be deposited on the third insulation layer 180 to fill the contact holes including the first contact hole CH1 and the second contact hole CH2, and may be patterned to form the third conductive line 191a, 191b, 192a, and 192b including the first source electrode 191a, the first drain electrode 191b, the second source electrode 192a, and the second drain electrode 192b. In this case, the first transistor TR1, a switching transistor, including the first semiconductor 131, the first gate electrode 151, the first source electrode 191a, and the first drain electrode 191b may be formed, and the second transistor TR2, a driving transistor, including the second semiconductor 132, the second gate electrode 172, the second source electrode 192a, and the second drain electrode 192b may be formed.

Referring to FIG. 3, an organic insulating material or an inorganic insulating material may be deposited on the third insulation layer 180 on which the third conductive line 191a, 191b, 192a, and 192b is formed, and may be patterned to form the fourth insulation layer 210 exposing a portion of the second drain electrode 192b. Then, a conductive material such as a metal, a transparent conductive oxide, etc. may be deposited on the fourth insulation layer 210 and patterned to form the first electrode 220. Then, an organic insulating material may be deposited on the fourth insulation layer 210 on which the first electrode 220 is formed and patterned to form the fifth insulation layer 230 exposing a portion of the first electrode 220. Then, an organic material may be deposited on the exposed portion of the first electrode 220 to form the emission layer 240. Then, a conductive material such as a metal, a transparent conductive oxide, etc. may be deposited on the emission layer 240 and the fifth insulation layer 230, and patterned to form the second electrode 250. In this case, the organic light emitting diode OLED including the first electrode 220, the emission layer 240, and the second electrode 250 may be formed.

The display device according to the embodiments may be applied to a display device included in a computer, a notebook, a mobile phone, a smartphone, a smart pad, a PMP, a PDA, an MP3 player, or the like.

Although the conductive lines, the display devices, and the methods of manufacturing the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A method of manufacturing a display device, comprising:
   forming a semiconductor layer on a substrate;
   forming a first conductive line on the semiconductor layer; and
   forming a second conductive line on the first conductive line, the second conductive line including a first layer including aluminum or an aluminum alloy, a second layer including a refractory metal nitride, and a third layer including a refractory metal,
   wherein the third layer of the second conductive line has a multilayer structure including a plurality of stacked sub-layers, and
   wherein the forming the second conductive line includes a vacuum break between forming the sub-layers.

2. The method of claim 1, wherein the first conductive line includes a first layer including aluminum or an aluminum alloy, a second layer including titanium nitride, and a third layer including titanium, and
   wherein the third layer of the first conductive line is formed without a vacuum breaking during forming the third layer of the first conductive line.

3. The method of claim 2, wherein a thickness of the third layer of the second conductive line is greater than or equal to a thickness of the third layer of the first conductive line.

4. The method of claim 1, further comprising:
   forming a first insulation layer covering the semiconductor layer before forming the first conductive line;
   forming a second insulation layer covering the first conductive line before forming the second conductive line;
   forming a third insulation layer covering the second conductive line;
   forming a first contact hole passing through the first insulation layer, the second insulation layer, and the third insulation layer to expose a portion of the semiconductor layer, and a second contact hole passing through the third insulation layer to expose a portion of the second conductive line; and
   forming a third conductive line on the third insulation layer, the third conductive line filling the first contact hole and the second contact hole.

5. The method of claim 4, wherein the first contact hole and the second contact hole are simultaneously formed.

6. The method of claim 1, further comprising:
   forming a first electrode on the second conductive line;
   forming an emission layer on the first electrode; and
   forming a second electrode on the emission layer.

* * * * *